(12) United States Patent
Lee

(10) Patent No.: US 6,380,079 B1
(45) Date of Patent: Apr. 30, 2002

(54) METAL WIRING IN SEMICONDUCTOR DEVICE AND METHOD FOR FABRICATING THE SAME

(75) Inventor: Jung Won Lee, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/709,624

(22) Filed: Nov. 13, 2000

(30) Foreign Application Priority Data

Dec. 28, 1999 (KR) ............................................. 99-63981

(51) Int. Cl.$^7$ ................................................. H01L 21/44
(52) U.S. Cl. ....................... 438/675; 438/626; 438/627; 438/629; 438/643; 438/645
(58) Field of Search ................................. 438/627, 643, 438/629, 626, 645, 675, FOR 196, FOR 350, FOR 355

(56) References Cited

U.S. PATENT DOCUMENTS 5,055,423 A * 10/1991 Smith et al. ................ 437/178
5,427,981 A   6/1995 Choi ............................ 437/195

* cited by examiner

*Primary Examiner*—George Fourson
*Assistant Examiner*—Thanh V Pham
(74) *Attorney, Agent, or Firm*—Morgan, Lewis & Bockius LLP

(57) ABSTRACT

Metal wiring in a semiconductor device and method for fabricating the same, the metal wiring including a first interlayer insulating film having a first contact hole to a region of a semiconductor substrate, a barrier metal film on an inside surface of the first contact hole, a second interlayer insulating film having a second contact hole to the barrier metal film formed on the first interlayer insulating film, a contact plug in the first and second contact holes in contact with the barrier metal film, and a metal wiring formed on the second interlayer insulating film in contact with the contact plug, whereby permitting to form a barrier metal film under a contact hole regardless of an aspect ratio and an area of the contact hole.

14 Claims, 5 Drawing Sheets

METAL WIRING IN SEMICONDUCTOR DEVICE AND METHOD FOR FABRICATING THE SAME

BACKGROUND OF THE INVENTION

1. Field of the Invention

The present invention relates to a semiconductor device, and more particularly, to a metal wiring in a semiconductor device and a method for fabricating the same, which can form a stable barrier metal film inside a contact hole.

2. Background of the Related Art

The wiring in the semiconductor device is directed to multilayer wiring, keeping pace with the high density device packing trend, in which a size of a contact hole in a semiconductor substrate or a via hole between multilayer metal wiring is reduced as an area of the device is reduced. Recently, such reduced holes are mostly stuffed with a metal film by chemical vapor deposition. In the chemical vapor deposition for forming the metal film, a source gas and a reduction gas make reaction to form the metal film, when, as in general the source gas has a good reactivity with the semiconductor substrate or an aluminum wiring, to cause defects in source/drain regions formed in an active region when the source gas makes reaction with the semiconductor substrate, and to form compounds in an AlX group when the source gas makes reaction with an aluminum wiring, which causes a problem of a wiring reliability due to an increased resistance. Therefore, in order to suppress mutual diffusion or chemical reaction between different materials, a barrier metal film is formed before the formation of the metal wiring, of which related art method will be described, wherein the barrier metal film is formed in a contact hole, with reference to the attached drawings. FIGS. 1A~1D illustrate sections showing the steps of a related art method for fabricating a metal wiring.

Referring to FIG. 1A, the related art method for fabricating a metal wiring starts with depositing an interlayer insulating film (Inter-Layer Dielectric: ILD, or Inter-Metal Dielectric: IMD) 2 on a semiconductor substrate 1. The interlayer insulating film 2 is formed for insulating a transistor for driving a device from a capacitor or a metal wiring, or between overlying and underlying wiring in multilayered wiring. And, though not shown in the drawing, a photoresist film is coated on the interlayer insulating film 2, and selectively patterned by exposure and development until one region of the interlayer insulating film 2 is exposed, and used as a mask in subjecting the interlayer insulating film 2 to anisotropic etching, to form a contact hole 3 in one region of the semiconductor substrate 1. The contact hole 3 may be formed in source/drain regions, or on an underlying metal wiring in multilayered metal wiring. As shown in FIG. 1B, a barrier metal film 4 is deposited on an entire surface of the interlayer insulating film 2 inclusive of the contact hole 3 by physical, or chemical vapor deposition, and a chemical vapor deposition metal film 5 is formed on the barrier metal film 4 to stuff the contact hole 3. As shown in FIG. 1C, the chemical vapor deposition metal film 5 is removed by plasma etching or CMP (Chemical Mechanical Polishing) to leave the chemical vapor deposition film 5 only in the contact hole 3, to form a plug 5a in the contact hole 3. In this instance, the barrier metal film 4 is left intact on the interlayer insulating film 2. Then, as shown in FIG. ID, a metal wiring 6 is formed on the barrier metal film 4 so as to be in contact with the plug 5a by physical vapor deposition.

However, the foregoing related art method for fabricating a metal wiring in a semiconductor device has the following problems.

An aspect ratio of the contact hole, which is formed on source/drain regions or on an underlying metal wiring in multilayered metal wiring, becomes the greater while an area of the contact hole becomes the smaller as a device packing density becomes the higher and a memory size of the device becomes the larger. According to this, formation of the barrier metal film for suppressing defects and diffusion under the contact hole is difficult, and the formation of the barrier metal film on an entire inside surface of the contact hole increases a resistance of the metal wiring.

SUMMARY OF THE INVENTION

Accordingly, the present invention is directed to a metal wiring in a semiconductor device and a method for fabricating the same that substantially obviates one or more of the problems due to limitations and disadvantages of the related art.

An object of the present invention is to provide a metal wiring in a semiconductor device and a method for fabricating the same, in which a barrier metal film can be formed under a contact hole regardless of an aspect ratio and an area of the contact hole.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the metal wiring in a semiconductor device includes a first interlayer insulating film having a first contact hole to a region of a semiconductor substrate, a barrier metal film on an inside surface of the first contact hole, a second interlayer insulating film having a second contact hole to the barrier metal film formed on the first interlayer insulating film, a contact plug in the first and second contact holes in contact with the barrier metal film, and a metal wiring formed on the second interlayer insulating film in contact with the contact plug.

In other aspect of the present invention, there is provided a method for fabricating a metal wiring in a semiconductor device, including the steps of (1) forming a first interlayer insulating film on a semiconductor substrate having a first contact hole to a region of the semiconductor substrate, (2) forming a barrier metal film on a surface of the first contact hole, (3) forming a second interlayer insulating film on the first interlayer insulating film having a second contact hole to the barrier metal film, (4) forming contact plugs only in the first and second contact holes in contact with the barrier metal film, and (5) forming a metal wiring on the second interlayer insulating film in contact with the contact plugs.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
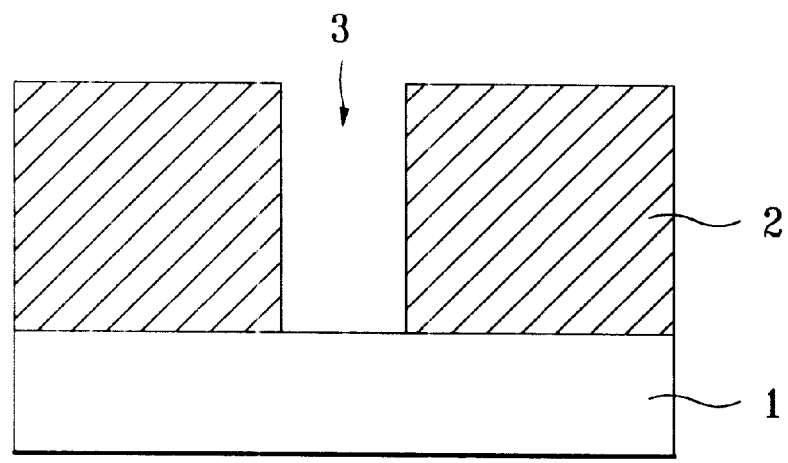
FIGS. 1A~1D illustrate sections showing the steps of a related art method for fabricating a metal wiring in a semiconductor device.
Figure 1B:
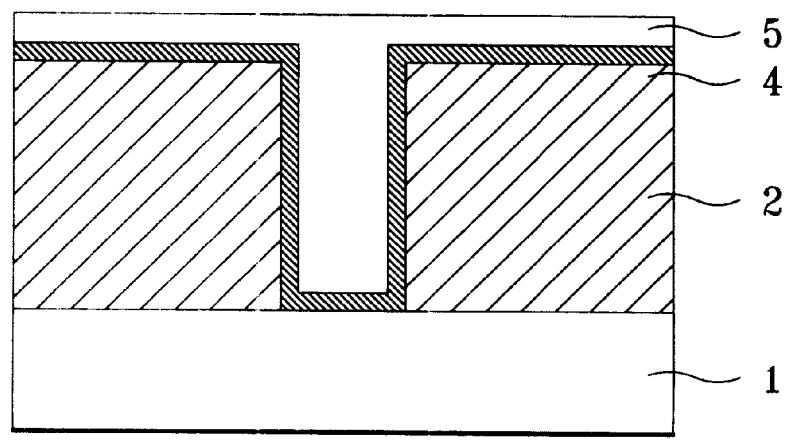
Figure 1C:
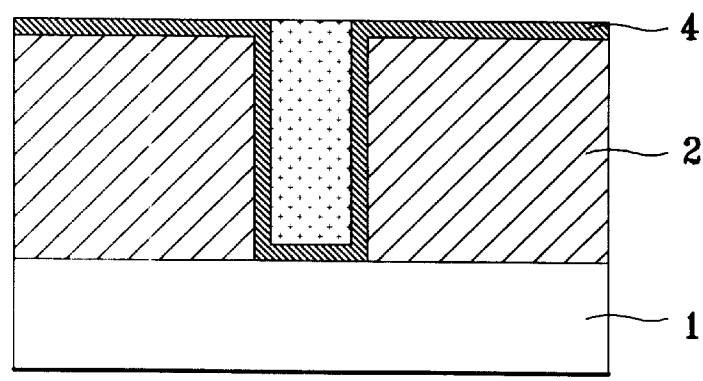
Figure 1D:
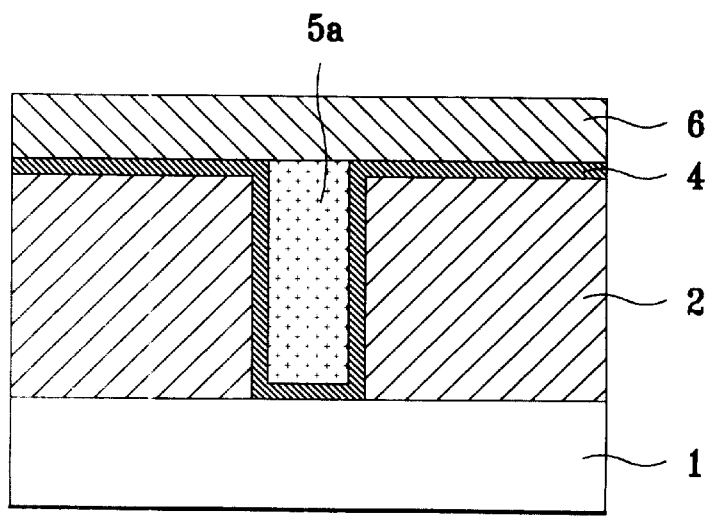
Figure 2:
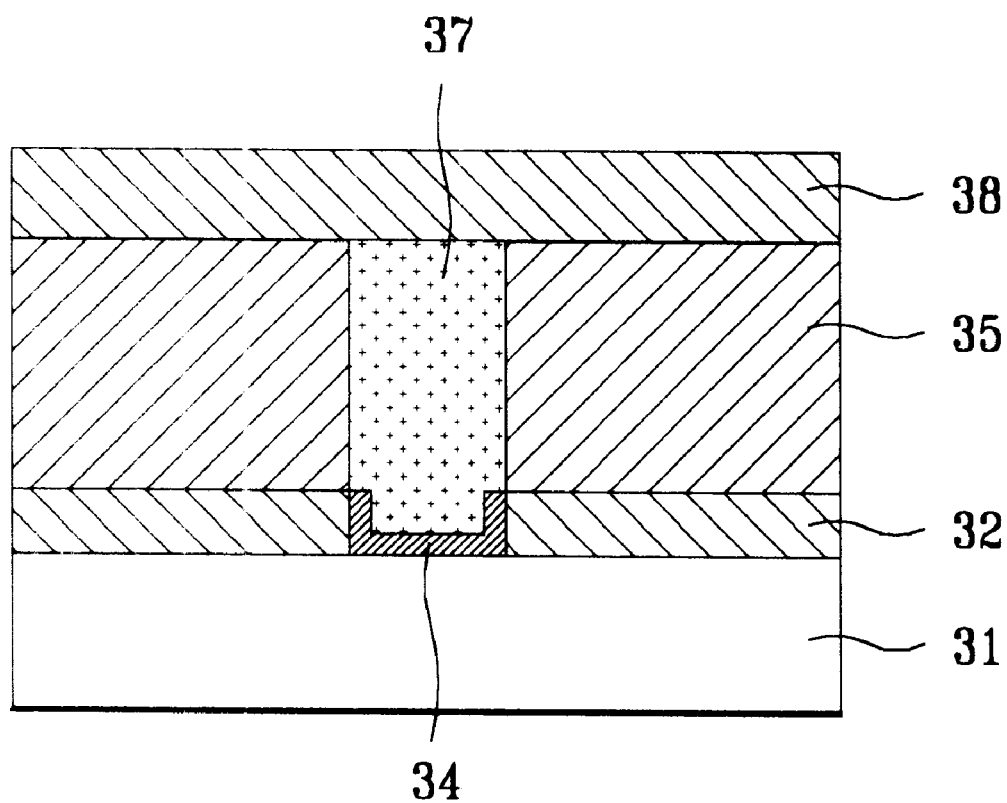
FIG. 2 illustrates a section showing a metal wiring in a semiconductor device in accordance with a preferred embodiment of the present invention.

Reference will now be made in detail to the preferred embodiments of the present invention, examples of which are illustrated in the accompanying drawings. FIG. 2 illustrates a section showing a metal wiring in a semiconductor device in accordance with a preferred embodiment of the present invention, and FIGS. 3A~3E illustrate sections showing the steps of a method for fabricating a metal wiring in accordance with a preferred embodiment of the present invention.

Referring to FIG. 2, the metal wiring in a semiconductor device in accordance with a preferred embodiment of the present invention includes a first interlayer insulating film 32 having a first contact hole 33 (see FIG. 3A) formed in one region of a semiconductor substrate 31, and a barrier metal film 34 on a bottom and sidewalls of the first contact hole 33. Though not shown, the first contact hole 33 may be formed on source/drain regions of a transistor in the semiconductor substrate 31, or on a lower metal wiring of multilayered metal wiring. The first interlayer insulating film 32 has a deposition thickness of 50~1000 Å, the barrier metal film 34 has a deposition thickness in a range of 10~1000 Å, thinner than the first interlayer insulating film 32, and the first contact hole 33 has a width of 0.01~1 $\mu$m. And, there is a second interlayer insulating film 35 having a second contact hole 36 (see FIG. 3C) to the barrier metal film 34 formed on the first interlayer insulating film 32. The second contact hole 36 has a width the same with the first contact hole 33, and the second interlayer insulating film 35 has a thickness of 1000~20,000 Å. There is a contact plug 37 formed in the second contact hole 36 on the barrier metal film 34, and there is a metal wiring 38 formed on the second interlayer insulating film 35 in contact with the contact plug 37.

The method for fabricating a metal wiring in accordance with a preferred embodiment of the present invention will be explained.

Figure 3A:
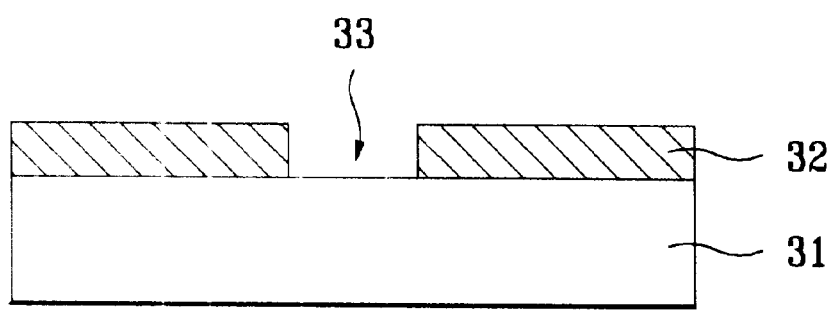
FIGS. 3A~3E illustrate sections showing the steps of a method for fabricating a metal wiring in accordance with a preferred embodiment of the present invention.
Figure 3B:
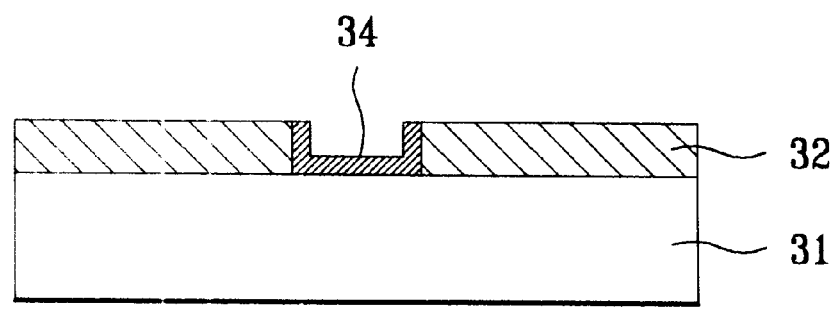
Figure 3C:
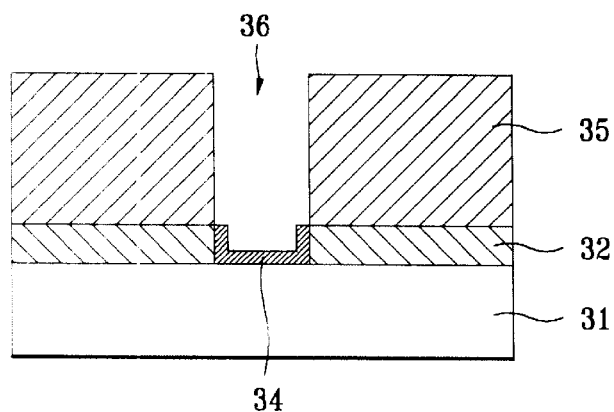
Figure 3D:
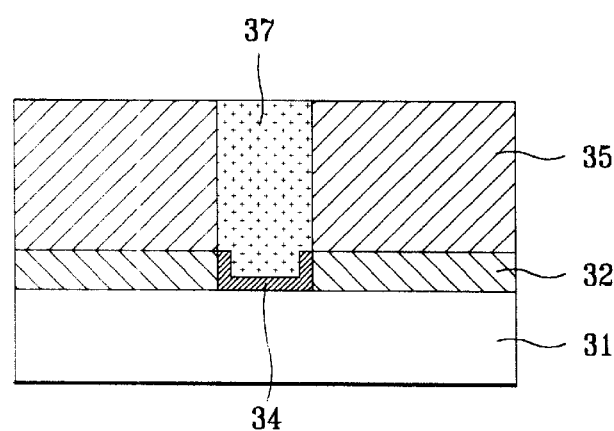
Figure 3E:
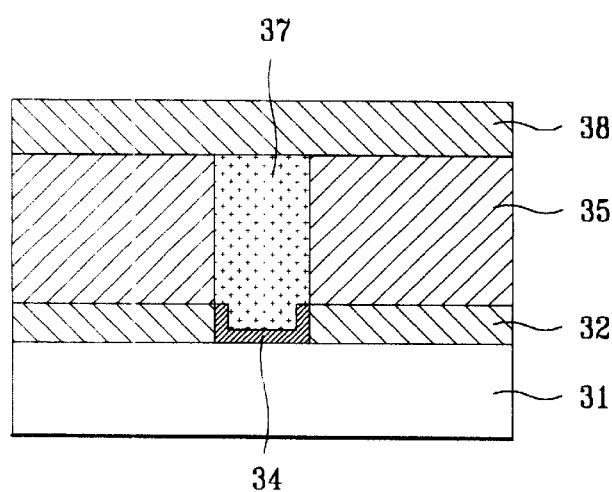

Referring to FIG. 3A, a first interlayer insulating film 32 (Inter-Layer Dielectric: ILD) or Inter-Metal Dielectric: IMD) is deposited on the semiconductor substrate 31, to a thickness of 50~1000 Å. The interlayer insulating film 32 is formed, for insulating a transistor for driving a device from a capacitor or metal wiring, or for insulating between an overlying metal wiring and an underlying metal wiring in multilayered metal wiring. Though not shown in the drawing, a photoresist film is coated on a first interlayer insulating film 32, and patterned by exposure and development to expose a portion thereof Then, the patterned photoresist film is used as a mask in patterning the first interlayer insulating film 32 by anisotropic etching, to form a first contact hole 33 to the semiconductor substrate 31 with a width of 0.01~1 $\mu$m. The contact hole 33 may be formed to the source/drain regions of a transistor or to a lower metal wiring of multilayered metal wiring. As shown in FIG. 3B, a barrier metal film 34 is deposited on an entire surface of the first interlayer insulating film 32 inclusive of the first contact hole 33 by physical vapor deposition. The barrier metal film 34 is deposited of a silicide or refractory metal to have a thickness of 10~1000 Å, thinner than the first interlayer insulating film 32. Then, all the barrier metal film 34 on the first interlayer insulating film 32 is removed by CMP (Chemical Mechanical Polishing) except in the first contact hole 33. As shown in FIG. 3C, a second interlayer insulating film 35 is deposited on an entire surface of the first interlayer insulating film 32 inclusive of the barrier metal film 34, to a thickness of 1000~20,000 Å. Though not shown in the drawing, a photoresist film is coated on the second interlayer insulating film 35, and selectively patterned by exposure and development until an upper portion of the first contact hole 33 is exposed. The patterned photoresist film is used as a mask in subjecting the second interlayer insulating film 35 to anisotropic etching until the barrier metal film 34 formed in the first contact hole 33 is exposed to form a second contact hole 36 to a width the same with the first contact hole 33. Then, as shown in FIG. 3D, a contact plug 37 is formed only on the barrier metal film 34 on the bottom of the first contact hole 33 and in the first and second contact holes 33 and 36. Thus, the formation of the contact plug 37 by the selective chemical vapor deposition permits to dispense with separate etching or polishing as no chemical vapor deposition metal film (a material of the contact plug 37) is not deposited on the second interlayer insulating film 35. Then, as shown in FIG. 3E, a metal wiring 38 is formed on the second interlayer insulating film 35 to be in contact with the contact plug 37 by physical vapor deposition.

The metal wiring in a semiconductor device and method for fabricating the same of the present invention have the following advantages.

First, the formation of the contact hole over two times permits to form the barrier metal film and the plug in the contact hole effectively without defects regardless of the step or size of the contact hole.

Second, the formation of the contact plug only in the first and second contact holes by the selective chemical vapor deposition made available by the present invention can dispense with separate etching or polishing in formation of the contact plug, that simplifies the fabrication process.

Third, the formation of the barrier metal film only on a surface of the first contact hole, but not on sidewalls of the second contact hole, permits to reduce a resistance of a metal wiring.

It will be apparent to those skilled in the art that various modifications and variations can be made in the metal wiring in a semiconductor device and method for fabricating the same of the present invention without departing from the spirit or scope of the invention. Thus, it is intended that the present invention cover the modifications and variations of this invention provided they come within the scope of the appended claims and their equivalents.

What is claimed is:

1. A metal wiring in a semiconductor device comprising:
   a first interlayer insulating film having a first contact hole to a region of a semiconductor substrate;
   a barrier metal film on an inside surface of the first contact hole;
   a second interlayer insulating film having a second contact hole to the barrier metal film formed on the first interlayer insulating film;
   a contact plug in the first and second contact holes in contact with the barrier metal film; and,
   a metal wiring formed on the second interlayer insulating film in contact with the contact plug.

2. A metal wiring as claimed in claim 1, wherein the first interlayer insulating film has a thickness in a range of 50~1000 Å.

3. A metal wiring as claimed in claim 1, wherein the barrier metal film has a thickness in a range of 10~1000 Å, thinner than the first interlayer insulating film.

4. A metal wiring as claimed in claim 1, wherein each of the first and second contact holes has a width in a range of 0.01~1 μm.

5. A metal wiring as claimed in claim 1, wherein the second interlayer insulating film has a thickness in a range of 1000~20,000 μm.

6. A metal wiring as claimed in claim 1, wherein the first contact hole is formed to source/drain regions of a transistor when the transistor is formed on the semiconductor substrate.

7. A metal wiring as claimed in claim 1, wherein the first contact hole is formed on a lower metal wiring when multilayered metal wiring is formed on the semiconductor substrate.

8. A method for fabricating a metal wiring in a semiconductor device, comprising the steps of:
   (1) forming a first interlayer insulating film on a semiconductor substrate having a first contact hole to a region of the semiconductor substrate;
   (2) forming a barrier metal film on a surface of the first contact hole;
   (3) forming a second interlayer insulating film on the first interlayer insulating film having a second contact hole to the barrier metal film;
   (4) forming contact plugs only in the first and second contact holes in contact with the barrier metal film; and,
   (5) forming a metal wiring on the second interlayer insulating film in contact with the contact plugs.

9. A method as claimed in claim 8, wherein the first interlayer insulating film has a thickness in a range of 50~1000 Å.

10. A method as claimed in claim 8, wherein the barrier metal film has a thickness in a range of 10~1000 Å, thinner than the first interlayer insulating film.

11. A method as claimed in claim 8, wherein each of the first and second contact holes has a width in a range of 0.01~1 μm.

12. A method as claimed in claim 8, wherein the second interlayer insulating film has a thickness in a range of 1000~20,000 μm.

13. A method as claimed in claim 8, wherein the step (2) includes the steps of,
   depositing the barrier metal film on the first interlayer insulating film inclusive of the first contact hole, and
   removing the barrier metal film on the first interlayer insulating film by chemical mechanical polishing for forming the barrier metal film only in the first contact hole.

14. A method as claimed in claim 8, wherein the step (4) is carried out by selective chemical vapor deposition.

* * * * *